United States Patent
Meier

[11] Patent Number: 5,834,933
[45] Date of Patent: Nov. 10, 1998

[54] METHOD FOR MAGNETOOPTIC CURRENT MEASUREMENT AND MAGNETOOPTIC CURRENT-MEASURING DEVICE

[75] Inventor: Markus Meier, Aarau, Switzerland

[73] Assignee: ABB Research Ltd., Zurich, Switzerland

[21] Appl. No.: 350,842

[22] Filed: Dec. 7, 1994

[30] Foreign Application Priority Data

Dec. 13, 1993 [DE] Germany .......................... 43 42 410.4

[51] Int. Cl.$^6$ .................................................. G01R 33/032
[52] U.S. Cl. ........................................ 324/117 R; 324/96
[58] Field of Search .................................. 324/117 R, 96, 324/244.1, 127, 126

[56] References Cited

U.S. PATENT DOCUMENTS

| | | | |
|---|---|---|---|
| 4,564,754 | 1/1986 | Sato et al. ................................... | 324/96 |
| 4,683,421 | 7/1987 | Miller et al. ............................... | 324/96 |
| 4,698,497 | 10/1987 | Miller et al. ............................... | 324/96 |
| 5,227,715 | 7/1993 | Ito et al. .................................... | 324/96 |
| 5,399,853 | 3/1995 | Maurice .................................... | 324/96 |

FOREIGN PATENT DOCUMENTS

| | | |
|---|---|---|
| 0 088 419 | 6/1986 | European Pat. Off. . |
| 0 290 780A1 | 11/1988 | European Pat. Off. . |
| 0 254 396B1 | 3/1992 | European Pat. Off. . |
| 0 289 791B1 | 9/1992 | European Pat. Off. . |
| 2 0 042 558 | 12/1971 | Germany . |
| 39 23 803 | 1/1991 | Germany . |
| 3326555 | 10/1997 | Germany . |
| WO89/00701 | 1/1989 | WIPO . |

*Primary Examiner*—Ernest F. Karlsen
*Attorney, Agent, or Firm*—Burns, Doane, Swecker & Mathis, L.L.P.

[57] ABSTRACT

Simple methods for magnetooptic current measurement and magnetooptic current-measuring devices are specified, which are independent of temperature influences on the measurement result and require no compensation device for the light intensity of light sources (LD1, LD2) employed. Light beams (1, 2) from the two laser light sources (LD1, LD2) are alternately polarized orthogonally relative to one another by means of a beam splitter (3), and are transmitted to light detectors ($D_A$, $D_B$) via collimators (4, 6), which are connected via a polarization-maintaining high-index birefringent HI fiber (5), through a magnetooptic current sensor (7), an analyzer (10), 2 collimators (11, 12) and multimode fibers (13) and (14). 1st and 2nd light output signals $S_{A1}$ and $S_{B1}$ as well as 3rd and 4th light output signals $S_{A2}$ and $S_{B2}$ are derived sequentially in time from the light detectors ($D_A$, $D_B$). A signal characterizer (232) of a control and evaluation device (15) is used to calculate a current intensity I detected by means of the magnetooptic current sensor (7), in accordance with $I=[S_{A1} \cdot S_{B2}/(S_{A2} \cdot S_{B1})-1]/(8 \cdot V)$, V being the magnetooptic Verdet's constant. It is also possible to work using frequency multiplexing instead of time multiplexing. It is possible to use a low-index birefringent LI fiber instead of a solid optical current sensor (7), light being sent through in both directions and evaluated separately.

8 Claims, 5 Drawing Sheets

METHOD FOR MAGNETOOPTIC CURRENT MEASUREMENT AND MAGNETOOPTIC CURRENT-MEASURING DEVICE

BACKGROUND OF THE INVENTION

1. Field of the Invention

The invention proceeds from a method for magnetooptic current measurement and from a magnetooptic current-measuring device according to the preamble of Patent claims 1, 2, 6 and 7.

2. Discussion of Background

In the preamble of Patent claims 1, 2, 6 and 7, the invention refers to a prior art as disclosed in EP-B1-0 254 396. A method for drift compensation in the case of an optomagnetic ammeter for direct current is described there, in which light of the same wavelength is guided from 2 laser diodes through an optomagnetic sensor via a polarizer, thereafter sent through an analyzer and detected by means of 2 photodetectors and converted into electric signals a and b. The polarizer and analyzer respectively deliver on the output side 2 output beams polarized at right angles to one another, the analyzer being rotated by comparison with the polarizer by 45° with regard to the polarization planes. Light beams from the polarizer, which are polarized at right angles to one another, pass alternatively through the optomagnetic sensor, so that 1st and 2nd output signals $a_1$, $a_2$ and $b_1$, $b_2$ are detected. The intensities of the input light beams are set in such a way that $(a+b)_1 - (a+b)_2$, and the amplification in the evaluation channels is set such that $(a-b)_1 + (a-b)_2 = 0$. The value $(a-b)_1 - (a-b)_2$ is delivered as an output signal which is proportional to the current. This method of current measurement, which is independent of coupler influences and modulator influences, is relatively expensive. For accurate DC converters, the beam splitters employed must have a stability of the division ratio of approximately 10 ppm over the entire temperature range.

It is known from the conference report by Kiyoshi Kurosawa, entitled A METHOD WITH TWO SOURCES FOR ACCURATE D.C. CURRENT MEASUREMENT USING FARADAY EFFECT, 9th Optical Fiber Sensors Conference, Florence, 4–6 May 1993, pages 439 to 442 to achieve a high measuring accuracy in the case of a measuring arrangement in accordance with the above-named EP-B1-0 254 396 by using two light sources of different wavelengths and forming the ratio $(a_1/a_2)/(b_2/b_1)$ as output signal for calculating the current. In this case, the spectral sensitivities of the channels must be stable over time and temperature. The multimode fibers employed place relatively high demands on the light sources.

SUMMARY OF THE INVENTION

Accordingly, one object of the invention as it is described in patent claims 1, 2, 6 and 7 is to provide a novel achievement of the object of developing a method for magnetooptic current measurement and a magnetooptic current-measuring device of the type mentioned at the beginning in such a way as to enable current measurement independent of temperature influences with a low outlay both for direct current and for alternating current.

An advantage of the invention resides in that there is no need for a compensation device for the light intensity of the light sources.

BRIEF DESCRIPTION OF THE DRAWINGS

A more complete appreciation of the invention and many of the attendant advantages thereof will be readily obtained, with the aid of exemplary embodiments, as the same becomes better understood by reference to the following detailed description when considered in connection with the accompanying drawings, wherein.

DESCRIPTION OF THE PREFERRED EMBODIMENTS

Figure 1:
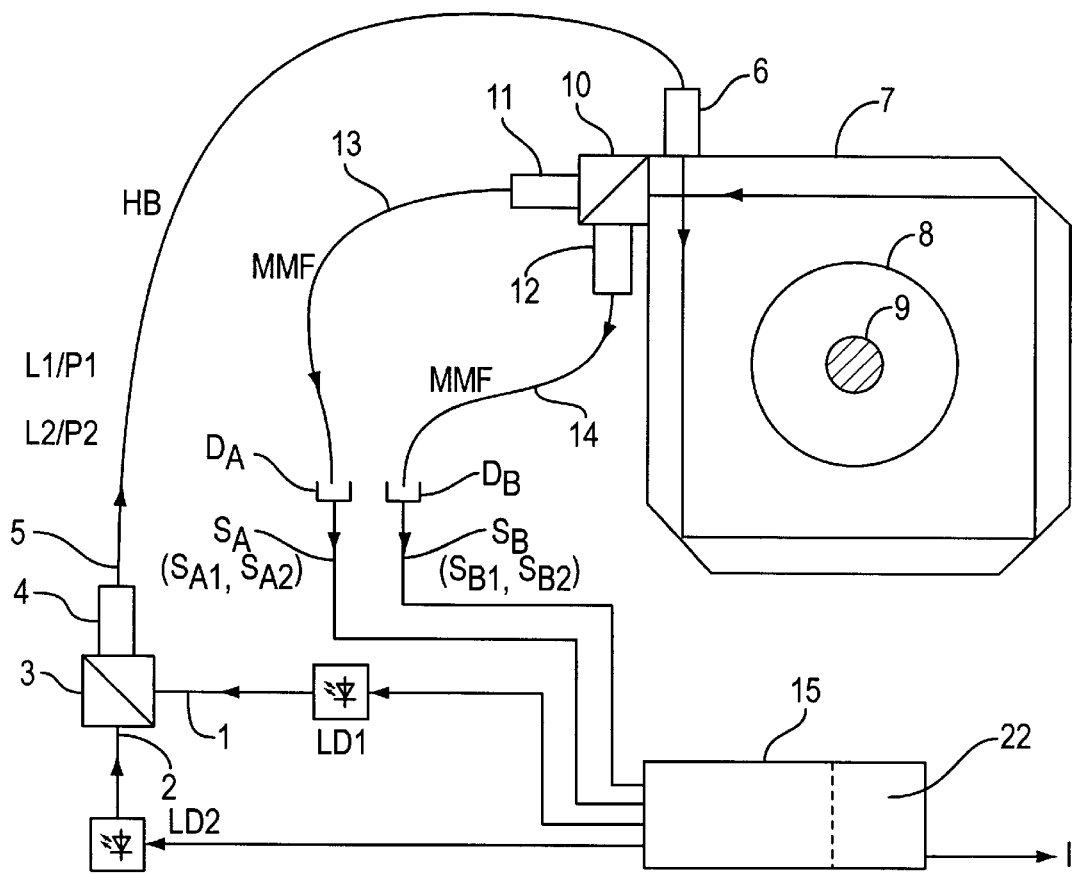
FIG. 1 shows a magnetooptic current-measuring device having a solid optical Faraday rotator as magnetooptic current sensor and having alternating operation of the light sources.
Figure 2A:
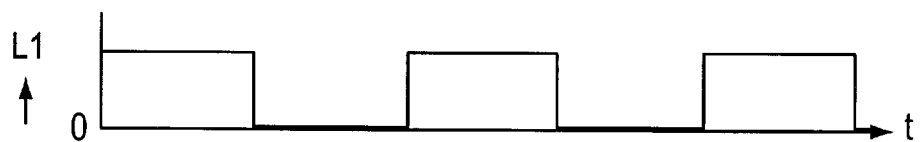
FIGS. 2a–2d show input and output signals of the magnetooptic current-measuring device in accordance with FIG. 1.
Figure 2B:
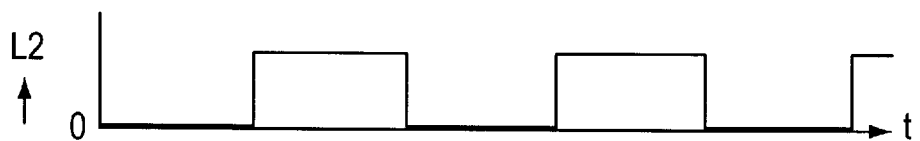

The magnetooptic current-measuring device in accordance with FIG. 1 exhibits laser diodes (LD1) and (LD2) which transmit light beams (1) and (2) in an alternating fashion, compare FIGS. 2a and 2b, to photodiodes or light detectors ($D_A$, $D_B$) via a polarizer or polarizing beam splitter (3), a graded-index lens or a collimator (4), a high-index birefringent, polarization-maintaining optical fiber or HI fiber (5) and a further collimator (6) through a magnetooptic current sensor (7), a polarizing beam splitter or analyzer (10), 2 collimators (11) and (12) connected thereto and from said collimators via optical multimode fibers or MM fibers (13) and (14). The light detectors ($D_A$, $D_B$) generate electric output signals ($S_A$, $S_B$) in a fashion proportional to the received light intensity and transmit them to a control and evaluation device (15). The magnetooptic current sensor (7) made from quartz or another transparent material has a plurality of reflecting side faces, and in its interior a cut-out (8) in which there is a current conductor (9).

Figure 3:
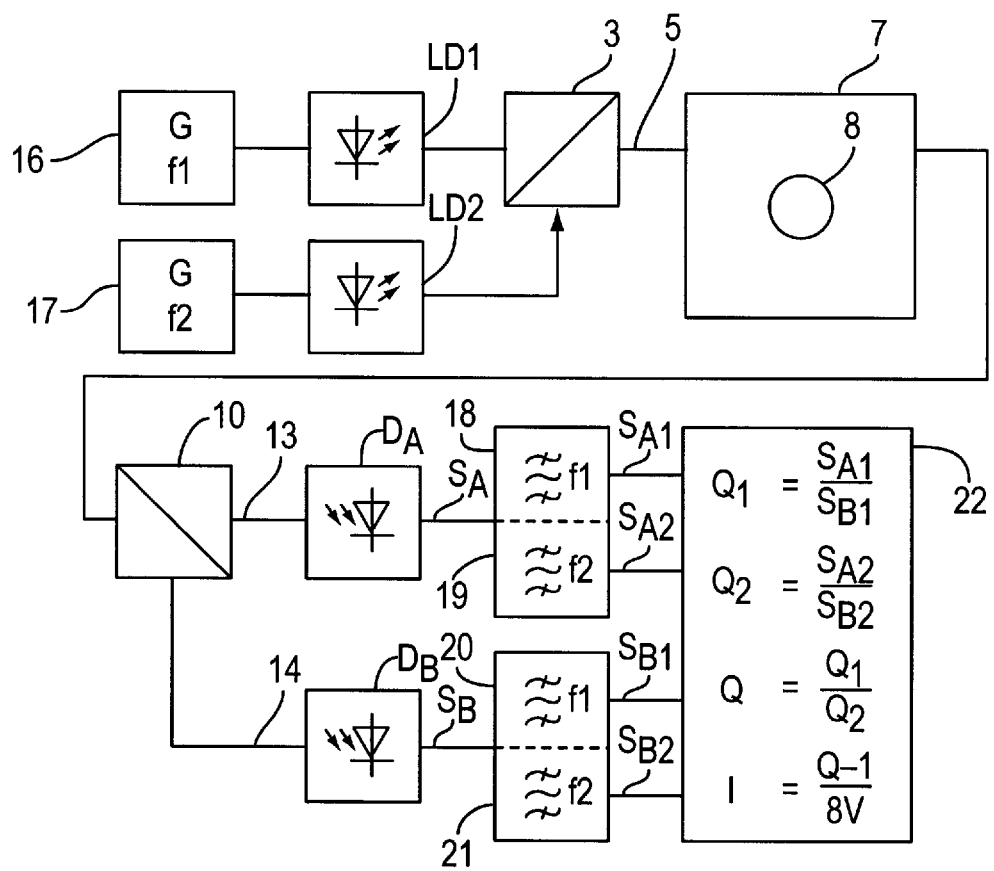
FIG. 3 shows a magnetooptic current-measuring device with frequency multiplex operation.
Figure 5:
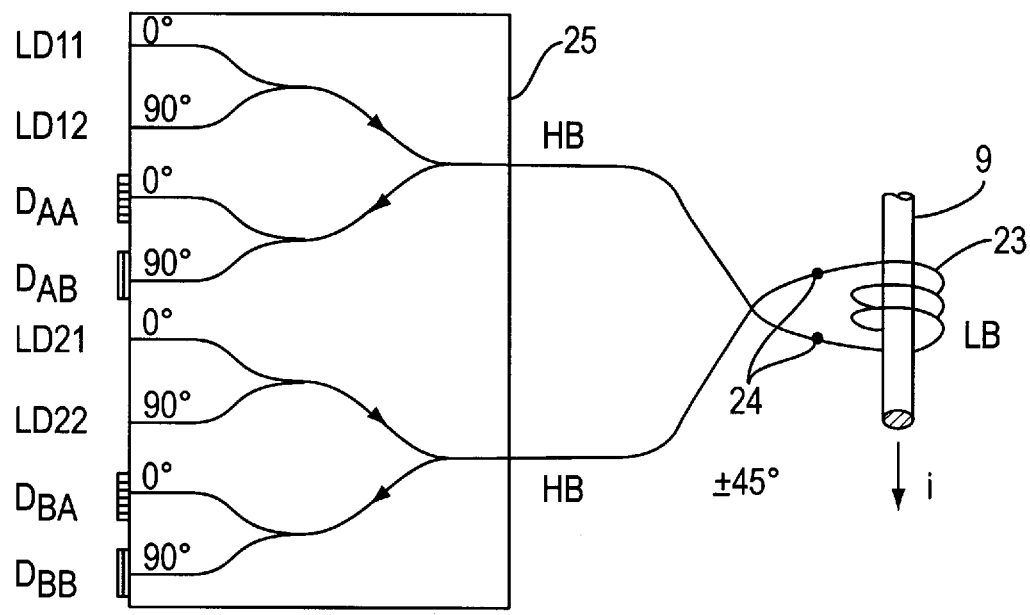
FIGS. 5 and 6 show magnetooptic current-measuring devices having low-index birefringent optical LI fibers as magnetooptic current sensors and having an integrated optical chip.
Figure 6:
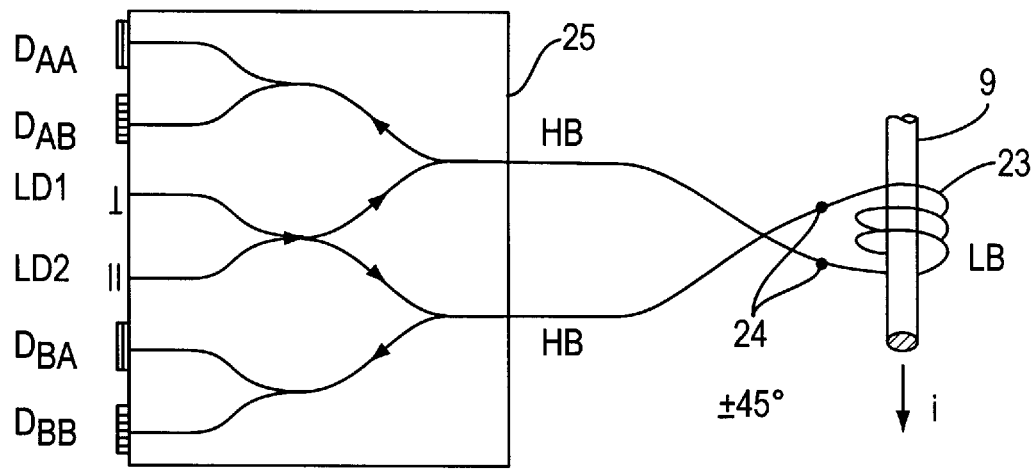

The current intensity (I) of an electric current (i), compare FIGS. 5 and 6, through the current conductor (9) is detected by means of the magnetooptic current sensor (7) with the aid of the action of the magnetooptic or Faraday effect and is calculated and output or made available to other devices (not represented) by an evaluation device or a signal characterizer (22), shown in more detail in FIG. 3, of the control and evaluation device (15).

The control and evaluation device (15) switches on the light sources (LD1, LD2) in an alternating fashion, so that the HI fiber (5) sequentially transmits polarized light beams or input light beams (L1) with a 1st direction (P1) of polarization from the light source (LD1) in periods between the instant (t0) and (t2), between (t4) and (t6), between (t8) and (t10) etc., compare FIG. 2a, and input light beams (L2) with a 2nd direction (P2) of polarization from the light source (LD2) in periods between the instants (t2) and (t4), between (t6) and (t8) etc., compare FIG. 2b. The beam splitter (3) delivers on the output side input light beams (L1, L2) for the magnetooptic current sensor (7) having directions (P1, P2) of polarization orientated at right angles to one another, compare FIG. 4. The polarization of one laser (LD1) is orientated on one axis of the HI fiber (5), while that of the other laser (LD2) is orientated on the other orthogonal axis of the HI fiber (5), the collimator (4) launching the light of the laser diodes (LD1) and (LD2) into the HI fiber (5). The light of these two light sources (LD1, LD2) is thereby transported in a polarization-maintaining fashion by the HI fiber (5). Located at the and of the HI fiber (5) is the collimator (6), which is of discrete design or implemented as a so-called SELPOC lens and which collimates the light (L1, L2). The light then enters the magnetooptic current sensor (7) in which it circulates once or, preferably, several times. The polarization plane is rotated there by the action of the magnetic field of the electric current (i) by an angle V·I proportional to the current (i), V signifying the magnetooptic or Verdet's constant, measured in rad/A, and I signifying the current intensity of the current (i), measured in A. At the output of the magnetooptic current sensor (7), the light is focussed onto the 2 MM fibers (13) and (14) via the 2nd polarizing beam splitter (10) and the 2 collimators (11, 12). The beam splitter (10) splits the light into 2 3rd and 4th directions (A, B) of polarization which are orientated at right angles to one another and which without current (i) are rotated by comparison with the two directions (P1, P2) of polarization of the 1st beam splitter (3) by 45°, compare FIG. 4. A geometrical beam splitter with downstream polarizers can be used instead of the polarizing beam splitter (10). The MM fibers (13) and (14) transport the light to the 2 light detectors ($D_A$, $D_B$) which are arranged at a distance and generate the electric output signals ($S_A$, $S_B$) in a fashion proportional to the light intensity. Said signals are then processed by the downstream control and evaluation device (15).

The light which emerges from the HI fiber (5) is split after the magnetooptic current sensor (7) into the two polarization channels (A, B). It is assumed for the subsequent calculation that the splitting-up is the same for both directions (P1) and (P2) of polarization. This assumption is justified since both polarizations emerge from the same HI fiber (5) and take the same path through the glass block (7) and the downstream splitting-up of the beam.

The two light sources (LD1, LD2) are switched on and off alternately. During a 1st phase in the time intervals (t0) to (t2), (t4) to (t6), (t8) to (t10) etc., in which the 1st laser (LD1) is switched on and the 2nd laser (LD2) is switched off, the two light detectors ($D_A$, $D_B$) are used to measure the following output signals $S_{A1}$, $S_{B1}$, compare FIGS. 2c and 2d:

$$S_{A1}=I_1 \cdot a \cdot D_a \cdot 0.5 \cdot (1+\sin(2 \cdot V \cdot I))$$

and $$S_{B1}=I_1 \cdot b \cdot D_b \cdot 0.5 \cdot (1-\sin(2 \cdot V \cdot I)).$$

Figure 2C:
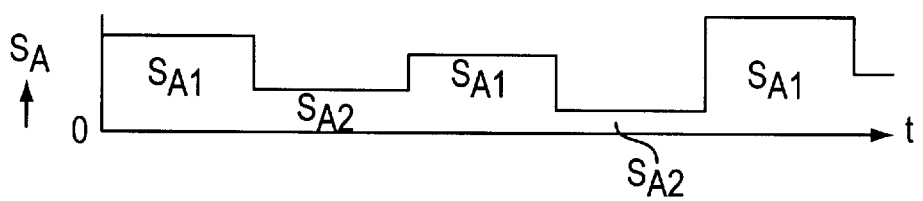
Figure 2D:
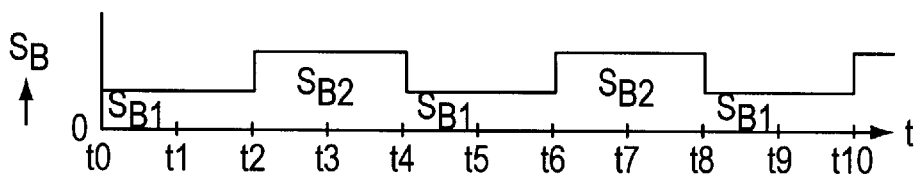

During a 2nd phase in the time intervals (t2) to (t4), (t6) to (t8) etc., in which the 1st laser (LD1) is switched off and the 2nd laser (LD2) is switched on, the two light detectors ($D_A$, $D_B$) are used to measure the following output signals $S_{A2}$, $S_{B2}$, compare FIGS. 2c and 2d:

$$S_{A2}=I_2 \cdot a \cdot D_a \cdot 0.5 \cdot (1-\sin(2 \cdot V \cdot I))$$

and $$S_{B2}=I_2 \cdot b \cdot D_b \cdot 0.5 \cdot (1+\sin(2 \cdot V \cdot I)).$$

In this case $I_1$ and $I_2$ signify the intensities of the light sources (LD1) and (LD2), a and b signify the transmission factors in the polarization channels (A) and (B), and $D_a$ and $D_b$ signify the sensitivities of the light detectors ($D_A$) and ($D_B$) in the channels (A) and (B), including the amplification in the electronics of the control and evaluation device (15) and/or of an analog-digital converter (not represented).

The following quotients are now formed:

$$Q1=S_{A1}/S_{B1} \approx (1+4 \cdot V \cdot I) \cdot a \cdot D_a/(b \cdot D_b),$$

$$Q2=S_{A2}/S_{B2} \approx (1-4 \cdot V \cdot I) \cdot a \cdot D_a/(b \cdot D_b)$$

and
therefrom $$Q \approx Q1/Q2 = 1+8 \cdot V \cdot I.$$

The current intensity (I) is yielded therefrom as:

$$I=(Q-1)/(8 \cdot V).$$

The variables Q and I thus obtained are independent of the two laser intensities ($I_1$ and $I_2$), of the unknown splitting ratio (a/b) and of the ratio of the diode sensitivities ($D_a/D_b$). A drift in all these variables does not disturb the measurement result.

The data evaluation must be performed in such a way that the output signals ($S_{A1}$, $S_{A2}$, $S_{B1}$, $S_{B2}$) of the light detectors ($D_A$, $D_B$) are measured at the corresponding times (t1, t3, t5, t7, t9), compare FIG. 2d, and the quotient formation is performed subsequently. Digital signal processing using a microprocessor or signal processor is recommended for this purpose. The switching and sampling rate should be chosen to be high by comparison with the highest signal frequency of the current signal (I) to be measured. The measuring accuracy depends on the accuracy of the A/D converters. These must have a satisfactory linearity and resolution. A very high accuracy or a symmetry between the two polarization channels (A, B) is, however, not necessary.

The above equation for Q holds approximately; it is based in a simplifying fashion on a linearization which holds for low values of the Faraday rotation and the rest position of the polarization at 45°. A precise calculation yields: $Q=Q1/Q2=[1+\sin(2 \cdot V \cdot I)]^2/[1-\sin(2 \cdot V \cdot I)]^2$ and thus $$I=(\arcsin[(Q^{0.5}-1)/(Q^{0.5}+1)])(2 \cdot V).$$

FIG. 3 shows a magnetooptic current-measuring device in which the current measurement is carried out using not the time multiplex method, as in accordance with FIGS. 1 and 2, but the frequency multiplex method. The same components are denoted in the same way.

The two lasers (LD1, LD2), with the orthogonal directions (P1, P2) of polarization, are modulated in intensity by 2 frequency generators (16, 17) having 2 different frequencies (f1, f2). The light emerging from the magnetooptic current sensor (7) is split in a polarizing beam splitter (10) and fed by means of multimode fibers (13, 14) to the two light detectors ($D_A$) and ($D_B$). The output signals $S_A=S_{A1}+S_{A2}$ and $S_B=S_{B1}+S_{B2}$ of the light detectors ($D_A$, $D_B$) for the two directions (A, B) of polarization are separated in downstream bandpass filters (18–21) with the aid of the different frequencies (f1, f2) into the output signals (SA1, SA2, SB1, SB2). The calculation of the quotients Q1, Q2 and Q as well as of the current intensity I is performed in an evaluation device or a computer or signal characterizer (22). The filtering and quotient formation can be performed both in an analog and in a digital fashion. The modulation frequencies must be distinctly higher than the highest signal frequency of the current (i) to be measured.

Figure 4:
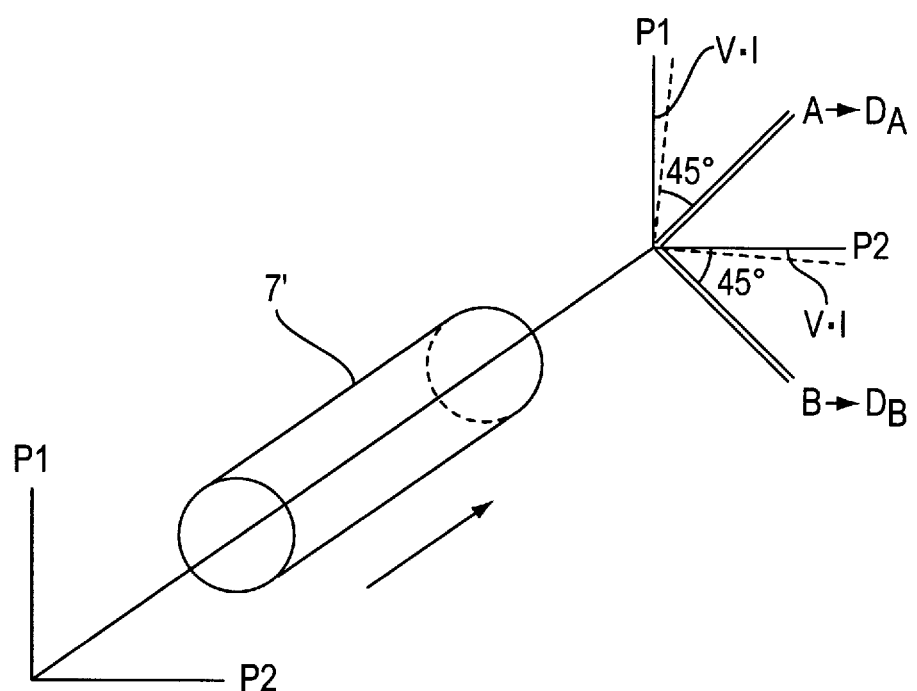
FIG. 4 shows a representation of the principle of the rotation of the direction of polarization of the light by the magnetooptic effect of the electric current to be measured.

FIG. 4 is a diagram of the measurement of direct current using orthogonal polarizers, (7') designating a Faraday rotator. The arrow indicates the direction of the traversal of the light.

In the exemplary embodiments, in accordance with FIGS. 5 and 6, a twisted low-index birefringent fiber or LI fiber (23), or a spun HI fiber with large circular birefringence is used as magnetooptic current sensor. Since temperature-dependent rotations of the polarization plane occur in these fibers, it is necessary to undertake measurement in both directions of the fiber in order to be able to separate the temperature effect from the Faraday effect with the aid of the non-reciprocal Faraday effect. An integrated optical microcircuit or an IO chip (25) in which monomode waveguide structures have been produced in glass by a diffusion process, is used here as input/output module for combining and separating the optical signals.

In the exemplary embodiment in accordance with FIG. 5, light from 2 mutually orthogonally polarized laser diodes (LD11, LD12 and lanched into the IO chip (25) and launched into the LI fiber (23) via 2 splitters, an HI fiber and a fiber splice or fiber coupler (24). The polarization plane of the light is rotated in the LI fiber (23) in a fashion proportional to the electric current (i) owing to the Faraday effect. In the case of a deenergized state, the light emerges in a linearly polarized fashion at the end of the LI fiber (23) via a fiber coupler (24) at 45° to the axes of a further HI fiber. From there, it is led back to the IO chip (25). It is led there to light detectors ($D_{BA}$, $D_{BB}$) via 2 beam splitters and analyzers at 0° and 90°, which are indicated at the left-hand edge of the IO chip (25). The measurement takes place in a completely analogous way in the other direction of the LI fiber (23) using mutually orthogonally polarized laser diodes (LD21, LD22) and light detectors ($D_{AA}$, $D_{AB}$). The control of the laser diodes (LD11, LD12, LD21, LD22) takes place in an electronic unit in a fashion analogous to the control and evaluation device (15) of FIG. 1. The IO chip (25) can be birefringent. It is advantageous for the axes of the HI fiber to be orientated on the axes of the IO chip (25). Inexpensive polarizers can be used.

FIG. 6 shows a design in which the two light sources (LD1, LD2) are used in both directions of the LI fiber (23). The light of these two laser diodes (LD1, LD2) is firstly united in the IO chip (25) in a beam splitter and thereafter split up again in order to be launched into the LI fiber (23) via the two fiber couplers (24). Detection and evaluation are performed in a fashion analogous to the exemplary embodiment in accordance with FIG. 5. Scattered light problems can occur in this exemplary embodiment, since the light of a light source not only takes the path, desired for the current measurement, via the sensor fiber to the detector, but can also as scattered light at the beam splitters, reach the detectors as an interference signal.

In evaluating the electric output signals ($S_{A1}$, $S_{A2}$, $S_{B1}$, $S_{B2}$) for the LI fiber (23) as magnetooptic current sensor, it must be borne in mind that owing to the temperature-induced rotations in the polarimeter angles T occur at the analyzers which fall outside a linear approximation even in the case of small Faraday rotations. In the evaluation, the same variables are formed as in the case of the exemplary embodiments in accordance with FIGS. 1 and 3: Q1, Q2 and Q. Because of the nonlinearities, it is necessary to calculate the current intensity (I) by means of evolution, division and arc-sin operations. The necessary steps in the calculation are set forth as follows: It holds for the outward path, denoted by H, and the 1st light source (LD11) that:

$S_{BA1} = I_{11} \cdot a_H \cdot D_{aH} \cdot 0.5 \cdot (1 + \sin(2 \cdot V \cdot I + 2 \cdot T))$, $S_{BB1} = I_{11} \cdot b_H \cdot D_{bH} \cdot 0.5 \cdot (1 - \sin(2 \cdot V \cdot I + 2 \cdot T))$.

It holds for the outward path and the 2nd light source (LD12) that:

$S_{BA2} = I_{12} \cdot a_H \cdot D_{aH} \cdot 0.5 \cdot (1 + \sin(2 \cdot V \cdot I + 2 \cdot T))$, $S_{BB2} = I_{12} \cdot b_H \cdot D_{bH} \cdot 0.5 \cdot (1 - \sin(2 \cdot V \cdot I + 2 \cdot T))$.

If these variables are used to calculate the outward path quotients Q1H, Q2H and QH, the result is:

$2 \cdot V \cdot I + 2 \cdot T = \arcsin[(QH^{0.5} - 1)/(QH^{0.5} + 1)]$.

It holds for the return path, denoted by R, and the 3rd light source (LD21) that:

$S_{AA1} = I_{21} \cdot a_R \cdot D_{aR} \cdot 0.5 \cdot (1 + \sin(2 \cdot V \cdot I - 2 \cdot T))$, $S_{AB1} = I_{21} \cdot b_R \cdot D_{bR} \cdot 0.5 \cdot (1 - \sin(2 \cdot V \cdot I - 2 \cdot T))$.

It holds for the return path and the 4th light source (LD22) that:

$S_{AA2} = I_{22} \cdot a_R \cdot D_{aR} \cdot 0.5 \cdot (1 - \sin(2 \cdot V \cdot I - 2 \cdot T))$, $S_{AB2} = I_{22} \cdot b_R \cdot D_{bR} \cdot 0.5 \cdot (1 + \sin(2 \cdot V \cdot I - 2 \cdot T))$.

If these variables are used to calculate the return path quotients Q1R, Q2R and QR, the result is:

$2 \cdot V - 2 \cdot T = \arcsin[(QR^{0.5} - 1)/(QR^{0.5} + 1)]$.

This yields the current intensity (I) in accordance with:

$I = (\arcsin[(QH^{0.5} - 1)/(QH^{0.5} + 1)] + \arcsin[(QR^{0.5} - 1)/(QR^{0.5} + 1)])/(4 \cdot V)$.

The double indices 11, 12, 21, 22 in the case of the variable (I) relate to the light source, and the indices H and R in the case of the variables (a, b, $D_a$, $D_b$) relate to the outward and return paths.

Obviously, the frequency multiplex method can also be used in this case instead of the time multiplex method. It is important that differently polarized light is guided in opposite directions through the optical fiber (23) and evaluated separately.

Instead of 2 light sources as represented in FIGS. 1 and 3, it is possible to use only one light source, the two polarizations being generated by a modulator sequentially in time in an elactrooptic or magnetooptic fashion.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for magnetooptic current measurement, wherein
a) first and second input light beams are guided in first and second directions of polarization, oriented at right angles to one another,
b) through a magnetooptic current sensor and
c) subsequently through an analyzer by means of third and fourth directions (A, B) of polarization, oriented at a prescribable angle relative to one another,
d) from which analyzer at least first and second output light beams in the third and fourth directions (A, B) of polarization are transmitted to at least first and second light detectors at which, on the output side, at least first and second output signals ($S_A$, $S_B$; $S_{A1}$, $S_{A2}$, $S_{B1}$, $S_{B2}$) which are proportional to the received light intensity can be tapped,
e) the third and fourth directions (A, B) of polarization of the analyzer being rotated by a prescribable angle relative to the first and second directions of polarization of the input light beams into the magnetooptic current sensor, and f) said first and second output signals being derived from said first input light beam via the output side of the first and second light detectors, and g) third and fourth output signals being derived from said second input light beam via the output side of the first and second light detectors, wherein h) current intensity I detected by the magnetooptic current sensor is output proportional to at least one of:

$$I = \{\arc\sin [(Q^{0.5}-1)/(Q^{0.5}+1)]\}/(2 \cdot V)i) \quad (1)$$

or at least approximately proportional thereto: and $$I = (Q-1)/(8 \cdot V) \quad (2)$$

where $$Q = S_{A1} \cdot S_{B2}/(S_{A2} \cdot S_{B1}),$$

and V signifies a magnetooptic Verdet's constant.

2. Method for magnetooptic current measurement, wherein a) first and second input light beams are guided in first and second directions of polarization, oriented at a prescribable angle relative to one another, b) through a magnetooptic current sensor and c) subsequently through an analyzer via third and fourth directions (A, B) of polarization, oriented at a prescribable angle relative to one another, d) from which analyzer at least first and second output light beams in the third and fourth directions (A, B) of polarization are transmitted to at least first and second light detectors at which, on the output side, at least first and second output signals ($S_{BA1}$, $S_{BB1}$; $S_{BA2}$, $S_{BB2}$) which are proportional to the received light intensity can be tapped, e) the third and fourth directions (A, B) of polarization of the analyzer being rotated by a prescribable angle relative to the first and second directions of polarization of the input light beams into the magnetooptic current sensor, and f) said first and second output signals being derived from said first input light beam via the output side of the first and second light detectors, and g) third and fourth output signals being derived from said second input light beam via the output side of the first and second light detectors, wherein h) the magnetooptic current sensor is an optical fiber, i) at least two of said first and second input light beams and third and fourth input light beams being additionally guided in an opposite direction by said optical fiber, j) fifth and sixth output signals being derived from at least one of the first and third input light beams via the output of third and fourth light detectors and k) seventh and eighth output signals being derived from at least one of the second and fourth input light beams via the output of the third and fourth light detectors, and l) current intensity I detected by the magnetooptic current sensor is output proportional to:

$$I = \{\arc\sin [(QH^{0.5}-1)/(QH^{0.5}+1)] + \arc\sin [(QR^{0.5}-1/(QR^{0.5}+1]\}/(4 \cdot V)$$

wherein $$QH = S_{BA1} \cdot S_{BB2}/(S_{BA2} \cdot S_{BB1}),$$

$$QR = S_{AA1} \cdot S_{AB2}/(S_{AA2} \cdot S_{AB1}),$$

and

V signifies a magnetooptic Verdet's constant.

3. The method as claimed in claim 1, wherein the input light beams have the same wavelength.

4. The method of claim 1, wherein differently polarized first and second or third and fourth input light beams are carried alternatingly, in chronological succession, through the magnetooptic current sensor.

5. The method of claim 1, wherein a) differently polarized first and second input light beams are modulated in their intensity with two different frequencies and b) the output signals of the light detectors are each subjected to bandpass filtration with these two frequencies in order to obtain the output signals of the light detectors which are proportional to optical power.

6. The method as claimed in claim 2, wherein the input light beams have the same wavelength.

7. The method as claimed in claim 2, wherein differently polarized first and second or third and fourth input light beams are carried alternatingly, in chronological succession, through the magnetooptic current sensor.

8. The method of claim 2, wherein a) differently polarized first and second input light beams are modulated in their intensity with two different frequencies, and b) the output signals of the light detectors are each subjected to bandpass filtration with these two frequencies in order to obtain the output signals of the light detectors which are proportional to optical power.

* * * * *